United States Patent [19]

Leveque

[11] Patent Number: 5,095,539
[45] Date of Patent: Mar. 10, 1992

[54] SYSTEM AND METHOD OF CONTROL TONE AMPLITUDE MODULATION IN A LINKED COMPRESSION-EXPANSION (LINCOMPLEX) SYSTEM

[75] Inventor: Howard Leveque, Columbia, Md.

[73] Assignee: AMAF Industries, Inc., Columbia, Md.

[21] Appl. No.: 569,980

[22] Filed: Aug. 20, 1990

[51] Int. Cl.⁵ .............................................. A03G 7/00
[52] U.S. Cl. ...................................... 455/72; 333/14; 381/106
[58] Field of Search ....................... 455/42, 43, 68, 72, 455/102; 333/14, 16; 381/106; 370/7

[56] References Cited

U.S. PATENT DOCUMENTS

| | | | |
|---|---|---|---|
| 4,271,499 | 6/1981 | Leveque | 370/7 |
| 4,539,707 | 9/1985 | Jacobs et al. | 455/72 |
| 4,701,953 | 10/1987 | White | 333/14 |
| 4,907,218 | 3/1990 | Leveque | 370/7 |

Primary Examiner—Reinhard J. Eisenzopf
Assistant Examiner—Lisa Charouel

[57] ABSTRACT

A linked compressor-expander (Lincompex) system and method varies the power of the control tone signal to maintain the power of the signal supplied to the transmitter substantially constant. The system measures a parameter related to the power level of the compressed information signal output from the compressor and varies the power of the control tone such that the sum of compressed information signal power and control tone power is substantially constant. When the input information signal drops below the compression range of the compressor, the control tone amplitude is thereby boosted to maintain the combined information signal and control tone signal power more nearly constant, and thus improve performance during low input information signal power levels. During these low input information signal power levels, the power of the control tone S/N is boosted so as to maintain higher control tone at the receive, thereby improving demodulator performance.

38 Claims, 6 Drawing Sheets

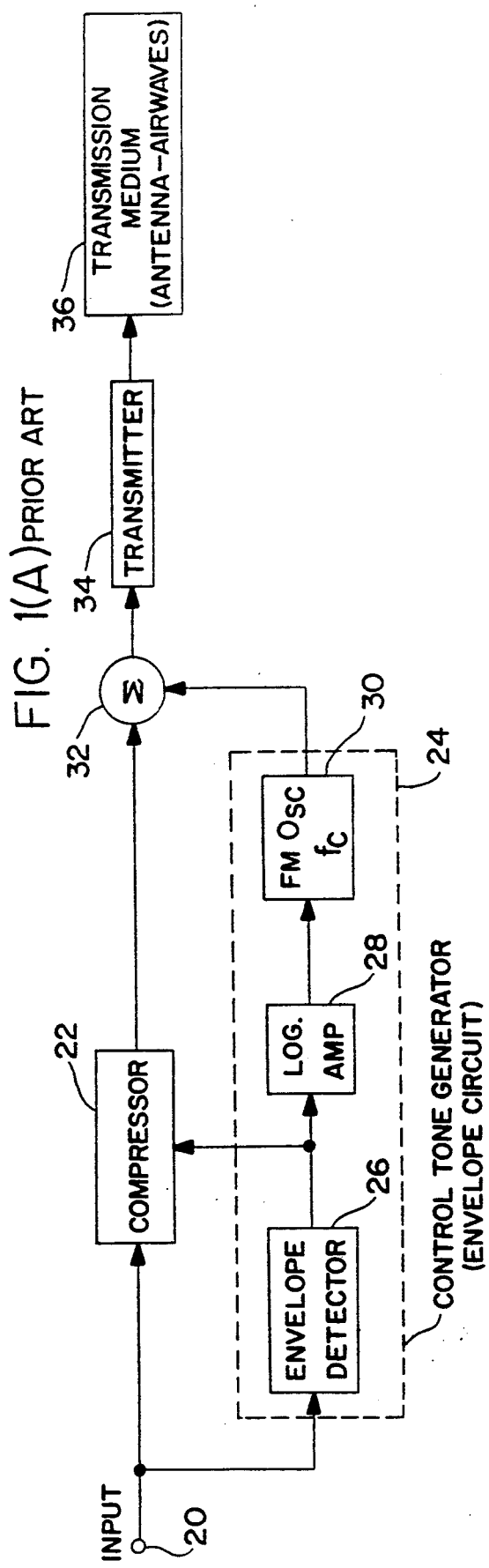
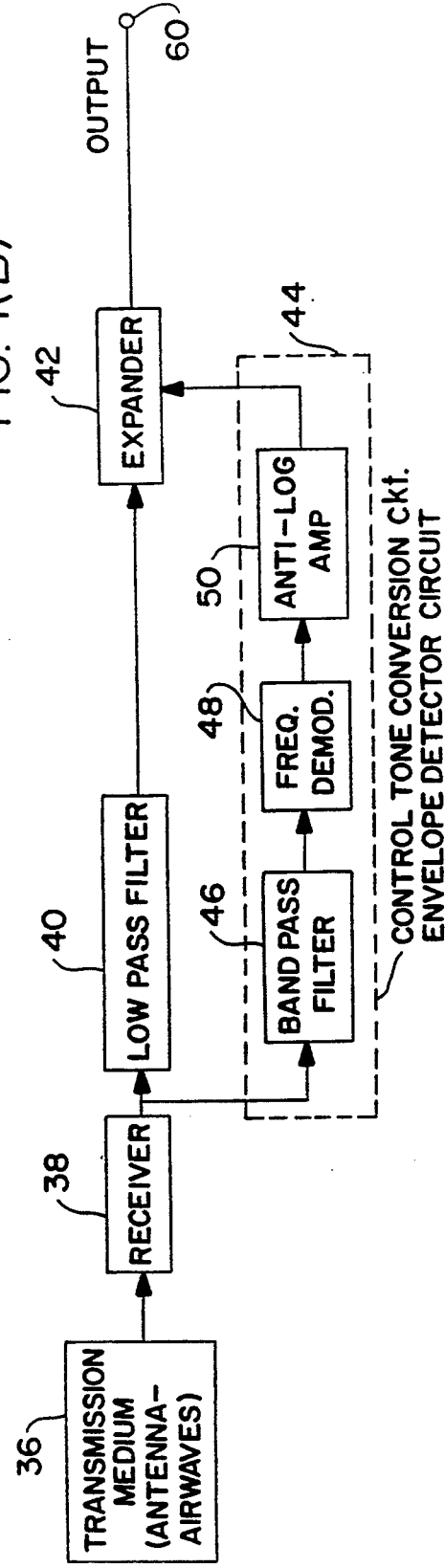
FIG. 1(A) PRIOR ART
FIG. 1(B) PRIOR ART

COMPRESSION

CONTROL TONE

5,095,539

SYSTEM AND METHOD OF CONTROL TONE AMPLITUDE MODULATION IN A LINKED COMPRESSION-EXPANSION (LINCOMPLEX) SYSTEM

FIELD OF THE INVENTION

The present invention relates to telecommunications systems in general, and more particularly, to the transmission of information such as that generated by voice or digital data using a linked compressor-expander (Lincompex) system.

BACKGROUND OF THE INVENTION

Linked compressor and expander (Lincompex) systems are known in the telecommunications art. A digital Lincompex system is disclosed in U.S. Pat. No. 4,271,499 ('499) issued June 2, 1981, to Leveque, the inventor of the present application and entitled "METHOD AND APPARATUS FOR DIGITALLY IMPLEMENTING A LINKED COMPRESSOR-EXPANDER TELECOMMUNICATIONS SYSTEM". This Leveque '499 patent teaches the transmission of voice over a Lincompex system. Lincompex systems can also be utilized to transmit data (any complex waveform such as multi-tone data). Such a system is disclosed in U.S. Pat. No. 4,907,218 ('218) issued Mar. 6, 1990 also to Leveque, the inventor of the present application, and is entitled "System and Method of Transmitting A Complex Waveform Over A Communication Channel Utilizing Lincompex Techniques".

An exemplary Lincompex system is illustrated in FIGS. 1(A) and (B) of the present application. Information to be transmitted is introduced to an input 20 of the Lincompex system modulator as shown in FIG. 1(A). A control tone generator or envelope circuit 24 monitors the inputted information signal. An envelope detector 26 of the control tone generator (envelope circuit) 24 detects the envelope of the introduced information signal and develops an envelope signal having an voltage representative of the signal level of the introduced information signal. A compressor 22 compresses the inputted information signal. Compression is performed by dividing the signal by its envelope in pseudo-real time to produce a compressed information signal. A control tone is developed by supplying the envelope signal developed from the output of the envelope detector 26 to a logarithmic (log) amplifier 28 which then develops a signal representative of the logarithm of the envelope signal. The output of this log amplifier 28 is supplied to a control terminal of a voltage controlled FM oscillator 30 which generates a frequency that varies about a center frequency $F_c$ in relation to the variation of the input voltage supplied to its control terminal from the log amplifier 28 to develop an envelope signal as an output of the control tone generator (envelope circuit) 24.

A summer 32 then sums the compressed information signal developed at the output of the compressor 22 with the envelope signal developed the output of the voltage controlled FM oscillator 30 to form a combined information signal.

In this speech transmission system, the combined information signal outputted from the summer 32 is provided to a transmitter 34 which transmits the signal over a desired transmission medium 36. In a typical embodiment, a single sideband transmitter would normally transmit the modulated combined information signal through the atmosphere in a known manner.

A Lincompex demodulator is illustrated in FIG. 1(B). The demodulator receives the modulated combined information signal from the transmission medium 36, which normally includes an antenna for receiving radio waves from the atmosphere, supplying the received modulated combined information signal to a receiver 38 which demodulates the transmitted signal to reproduce the combined information signal. Typically, this receiver 38 would be a single sideband receiver which mixes the received modulated combined information signal with the carrier frequency to reproduce baseband combined information signal.

To recover the information from such a combined information signal, a low pass filter 40 removes the envelope information from the combined information signal. This allows the recovery of the compressed information signal containing the information 2. This compressed information is transmitted according to the Lincompex techniques at a substantially constant syllabic peak voltage which enables substantially complete modulation of the transmitter 34 of FIG. 1(A). This information must then be expanded to produce the necessary dynamic range for the recovered information signal to be supplied at the output 60. Accordingly, an expander 42 is utilized which essentially multiplies the compressed voice signal developed at the output of low pass filter 40 by the envelope signal which is recovered by a control tone conversion circuit 44.

The control tone conversion circuit 44 includes a bandpass filter 46 which recovers only the envelope signal from the combined information signal. This frequency modulated envelope signal originally developed by the voltage controlled FM oscillator 30 of FIG. 1(A) is then frequency demodulated by a frequency demodulator or discriminator 48 to recover the logarithm of the envelope. An anti-logarithm amplifier 50 is then utilized to recover the original envelope developed by the envelope detector 26 of FIG. 1(A). This original envelope signal is then used to recover the original voice signal by expanding the compressed voice signal via the expander 42 to provide the original signal to the output 60.

To transmit data having a complex waveform, a system shown in FIGS. 1(A) and 1(B) is modified to include frequency shifting devices which, for example, frequency shift the data bandwidth prior to compression and after expansion. Such a system is readily disclosed in the Leveque '218 Patent. Hereinbelow, a signal to be transmitted comprising either a voice signal or a complex signal such as modulated digital data will be referred to as complex information waveform.

In a Lincompex system such as that described above, the compressor 22 attempts to produce a compressed information signal at its output which is of constant power. However, virtually any introduced information signal provided at the input 20 will have substantial variations in signal amplitude. When the information signal to be transmitted is voice, there will be voice peaks in which the voice to be transmitted is extremely loud and silent passages between syllables and words where the introduced information signal is in essence absent. The compressor 22 attempts to convert this input information signal into a compressed signal having a constant output level. The compressor, however, does not create a signal where there is none and further, since the Lincompex system is a real world system rather than an "ideal" system, the compressor 22 can provide compression over only a limited dynamic range. For example, a preferred embodiment of such a Lincompex system might utilize a compressor which can compress signals within a 48 dB dynamic range. When signals fall outside this dynamic range, complete compression to a constant compressed signal can no longer occur. Consequently, compression is selected to typically occur in a range just below maximum input signal power. Thus, if the maximum input information signal power is at 0 dB, a compression would occur in the range between 0 dB and −48 dB. When the input information signal drops below −48 dB in this example, complete compression no longer occurs and the compressor output varies in proportion to the input information signal level. The performance of a typical compressor 22 is graphically illustrated in FIG. 2. FIG. 2 illustrates the relationship of the input signal to the compressed signal. Such a compressor produces a substantially constant power output signal for input signals within a range below input information signal peak power. Thus, full compression occurs within a range 10 of higher input information signal levels. At a point in time, sometimes known as the compression "knee", the compressor is no longer able to fully compress the input signal to a constant output signal level. Thus, the output of the compressor 22 becomes "linear" with the compress signal varying in proportion to the level of the input signal.

A basic object of Lincompex systems is to improve transmission of transmitted signals by maximizing transmitter frequency to at or near peak transmitter power. This is performed by transmitting the compressed signal near transmitter peak power with a generally constant amplitude control tone signal added thereto. When the input signal drops below the compressor "knee" such that the compress signal power begins to fall, the transmitter no longer transmits at peak power. The compressed signal during these times is reduced in power while the envelope signal remains of constant power.

During quite periods when the compressed signal output is therefore near zero, the total transmitted power of the combined information signal is near that of the control tone which is a relatively small percentage of normal signal power.

At the receiver, during such quite periods, the receiver must lock onto the control tone and will demodulate the content of the frequency band within which the compressed information signal normally resides. When substantially no signal is being transmitted, channel resident noise may approach or even exceed the level of the compressed information signal. If the signal lock is lost on the control tone, this noise can be expanded to a relatively high voltage level during demodulation.

Applicants have discovered that, when the compressed information signal falls below the compression "knee", the performance of a Lincompex system can be substantially enhanced by boosting the power level of the control tone signal. Boosting the power level of the control tone signal enhances the ability of the control tone signal to maintain signal lock. Further, this improvement can be obtained by better utilization of the transmitter power in an area where the compressed information signal has, in any event, lost power when compared to higher input information signal levels. This boosting of the control tone power when the compressed information signal power drops below the compressors maximum output power improves Lincompex performance not only with respect to voice signals but to data signals as well.

SUMMARY OF THE PRESENT INVENTION

An improved Lincompex System substantially eliminates distortion due to inadequate demodulation of a low S/N control tone by virtue of the concepts of the present invention when used to transmit any complex information waveform over a communication channel utilizing Lincompex techniques. According to the teachings of the present invention, the power level of the control tone for the compressed signal is increased when the compressed signal falls below a predetermined level at or near the compression "knee" to enhance the recoverability of the control tone so that the Lincompex demodulator can efficiently and properly quiet the output when quiet passages of the information signal are transmitted.

According to the teachings of one embodiment of the present invention, the power of the control tone of the transmitted combined information signal is variably attenuated prior to the summing of the compressed input signal and control tone. The power of the control tone is attenuated according to the power level of the compressed signal produced by a compressor circuit in the transmitter. The variable power attenuation ensures that the receiver of the combination information waveform maintains its lock on the control tone signal and is thus capable of properly quieting the received and expanded information signal during such quiet passages.

In the system of the present invention, the power level of the combined information signal is maintained at or near a constant level to better utilize the performance of the transmitter while allowing the receiver to move easily maintain a lock on the control tone. The power level of the control tone is varied in response to signals received by a control tone insertion control circuit which monitors the power level of the compressed signal to be transmitted by the transmitter. Upon detection of a change in power to a level below a predetermined level, the control tone insertion control circuit produces a signal which controls a variable attenuator located in the control tone's transmission path to increase control tone power. The variable attenuator determines or controls the power level of the control tone with respect to the power level of the compressed signal so as to maintain the power of the combined information signal substantially constant.

According to the teachings of another embodiment of the present invention, the power level of the control tone of the transmitted complex information waveform is variably attenuated prior to summing of the control tone and the compressed input signal. The power level of the control tone is attenuated according to the power level of a compressed signal produced by a compressor circuit in the modulator and peak/average power information detected by a peak power detection circuit at the output of the modulation. In other words, the power level of the control tone increases as the power level of the compressed information signal from the compressor decreases, thereby maintaining a constant power level for the transmitted signal.

OBJECTS OF THE INVENTION

It is therefore an object of the present invention to enhance the performance of a Lincompex system during periods of relatively low input information signal amplitudes;

It is another object of the present invention to improve the ability to maintain control tone signal lock between the transmitter and receiver during relatively low amplitude portions of the input information signal;

It is a further object of the present invention to improve performance of a Lincompex system as outlined above by boosting the control tone power during periods in which the compressor output falls below its normal peak amplitude so as to accomplish the above-mentioned advantages;

It is a further object to achieve these advantages not only for the transmission of voice but also for the transmission of any complex informational signal;

It is still another object of the present invention to enhance the performance characteristics of a Lincompex demodulator by boosting the amplitude of the transmitted control tone during quiet passages to thereby enhance control tone lock during such quiet passages as received by the Lincompex demodulator; and It is still another object of the present invention to provide a Lincompex system in which transmitter efficiency is optimized even during low amplitude portions of the input information signal.

These and other objects of the present invention will become more readily apparent from a better understanding of the preferred embodiments described below with reference to the following drawing figures.

BRIEF DESCRIPTION OF THE DRAWINGS

The present invention will become more fully understood from the detailed description given below and the accompanying drawings which are given by way of illustration only and are not intended to limit the present invention, and wherein:

FIG. 1(A) and (B) illustrate the transmitter and receiver sections of a prior art Lincompex system as described more thoroughly in the '499 patent.

The above-mentioned drawings will be described in detail in the following detailed description.

DETAILED DESCRIPTION OF THE PREFERRED EMBODIMENTS

The present invention will be described with reference to a general description of Lincompex techniques which may be implemented digitally or otherwise. However, the preferred embodiments contemplate the use of digital Lincompex techniques to practice the teachings of the present application. Accordingly, to the extent necessary, the Applicant hereby incorporates by reference the entirety of the disclosure of U.S. Pat. No. 4,271,499 entitled "Method and Apparatus for Digitally Implementing a Linked Compressor-Expander Telecommunications System" invented by the Inventor of the present application. Further the techniques of the present invention are useful for enhancing transmission of any complex waveform according to the techniques of the U.S. Pat. No. 4,907,218, entitled "System and Method of Transmitting A Complex Waveform Over a Communication Channel Utilizing Lincompex Techniques", invented by the Inventor of the present application, which is hereby incorporated by reference into the specification of the present application.

Figure 3A:
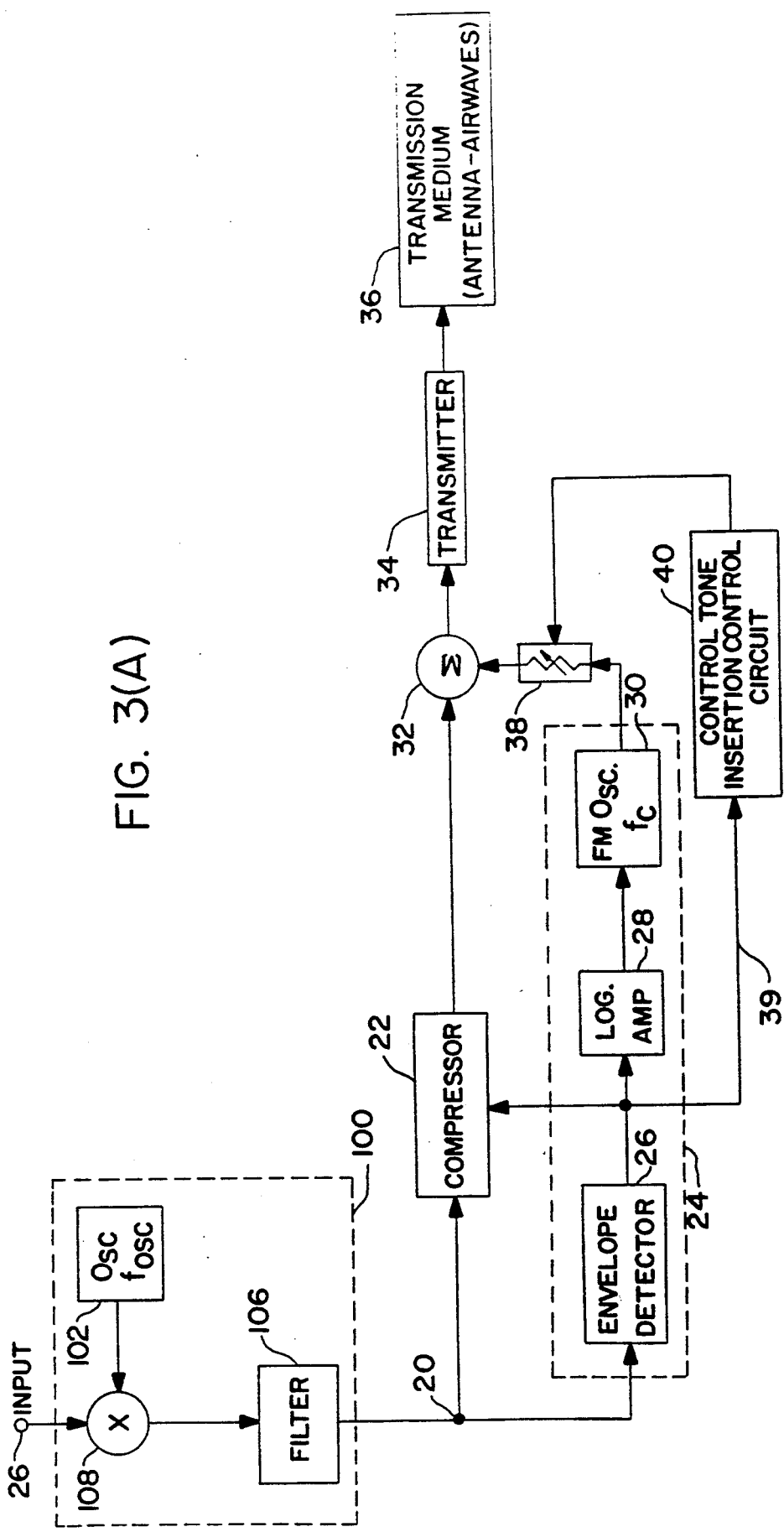
FIG. 3(a) illustrates one embodiment of a Lincompex modulator according to the present invention which compensates for power loss or attenuation in the compressed input signal according to the power level of the compressed signal.

FIG. 3(a) illustrates one embodiment of the system of the present invention for boosting the amplitude and power of the control tone during time periods when the power level of the compressed signal falls. The present invention as illustrated in the figure compensates for power level variations in the transmitted complex information waveform from the transmitter by controlling the attenuation factor of the control tone being generated by the Lincompex modulator. In other words, the present invention increases the power of the control tone when power of the input signal falls below a certain level. It should be understood the combined information waveform may be either a combination of a compressed voice signal and control tone, a combination of a compressed data signal and control tone, or other combinations of a compressed information waveform and control tone wherein a complex information waveform is transmitted by Lincompex techniques.

In FIG. 3(A), as in all Figures of the present application, like elements throughout the drawing Figures are identical. In the preferred embodiment of the present invention, as shown in FIG. 3(A), the Lincompex system may receive an input signal such as a voice signal, a 16-tone parallel-tone or multi-tone data signal at its input 20. However, it should be understood that any complex information waveform may be transmitted over the communications channel. While FIG. 3(a) shows mixer 100 as an exemplary system for ensuring adequate separation between the compressed data signal and envelope signal in the combined information signal when a complex wave is transmitted, it should be understood that, if adequate separation exists between the compressed information signal and control tone signal, this mixer 100 may be unnecessary. Further, it should be understood that the placement of mixers to ensure separation between the compressed information signal and control tone signal may be in any manner contemplated by the teachings of the above-mentioned '218 patent.

In this Lincompex modulator, a mixer 100 is provided to frequency shift the input data frequency spectrum to a desired higher frequency $F_{OSC}$ to insure that no overlapping between the input signal, when compressed, and the envelope signal frequency band occurs. Accordingly, an oscillator 102 supplies the mixing frequency $F_{OSC}$ to a frequency multiplier or mixer 104 where it is mixed with the data introduced from the input 20 to produce the a frequency shifted data signal. A filter 106 is then provided to band pass filter the mixed output to remove an undesired one of two sidebands produced by the mixing process. After filtering, only a single sideband is left which is frequency shifted to a desired frequency at the output of the filter 106. If only a voice signal is the input signal, the mixer 100 is not needed because the bands of the voice signal and the envelope signal frequency do not normally overlap when using Lincompex techniques. Therefore, in another embodiment where only voice is to be transmitted or when no overlap would exist, the mixer can be eliminated.

This frequency shifted data or non-frequency shifted voice signal (the "information signal") is then treated utilizing conventional Lincompex techniques by a compressor 22, envelope circuit 24, summer 32 and transmitter 34. A variable attenuator 38 is provided between the envelope circuit 24 and the summer 32. The variable attenuator 38 controls the power level of the generated control tone developed by envelope circuit 24 according to the power level information related to the power level of the compressed signal which is received by a control tone insertion control circuit 40.

The control tone generator 24 is connected to the input 20 for receiving an input information signal. The input 20 is also connected to the compressor 22. The compressor 22 compresses the inputted information signal by dividing the signal by its envelope in pseudo-real time to produce a compressed signal. The control tone generated by the control tone generator 24 represents the degree of compression of the input signal. To produce the control tone, a control tone generator 24 similar to the control tone generator 24 of FIG. 1(a) is utilized. In this control tone generator 24, an envelope signal is developed from the output of the envelope detector 26 and inputted into a logarithmic (log) amplifier 28 which then develops a signal representative of the logarithm of the envelope signal. The output of this log amplifier 28 is supplied to a control terminal of a voltage controlled FM oscillator 30 which generates a frequency varying about a central frequency $F_c$ in relation to the variation of the input voltage supplied to its control terminal from the log amplifier 28. This signal produced by the voltage controlled FM oscillator is the control tone outputted by the control tone generator 24.

A conventional variable attenuator 38 is connected to the output of the envelope circuit 24 and controls the power level of the control tone into the summer 32. The summer 32 sums the compressed signal developed at the output of the compressor 22 with the control tone developed at the output of the variable attenuator 38 to form a combined information waveform.

The control tone insertion control circuit 40 of the present invention may be constructed in a variety of ways. In the embodiment of FIG. 3(a), the control tone insertion control circuit monitors the envelope of the input information signal received at input 20 by monitoring envelope information supplied to the compressor 22 via envelope detection 26. In this embodiment, when this envelope information indicates that the envelope of the information signal has fallen below a minimum level, for example, −48 dB below maximum power, the control tone insertion circuit recognizes the power level and begins to reduce the impedance of variable attenuator 38 such that the envelope signal provided thereby to summer 32 begins to increase in power. Referencing FIG. 2, for example, the −48 dB threshold at which boosting of the control tone occurs might be illustrated as vertical line 16 indicating −48 dB below designed full-scale signal. As the input signal level as determined by the envelope circuit 24 continues to decrease from this level, the attenuation of the variable impedance 38 may proportionately decrease in a continuous fashion.

Figure 5:
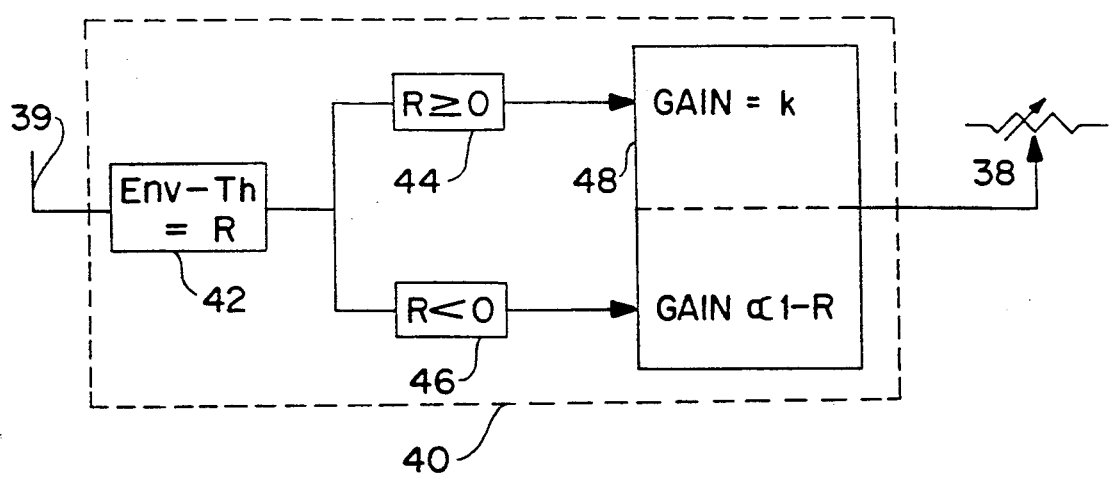
FIG. 5 illustrates an embodiment of the control tone insertion control circuit 40 of FIG. 3(a).

An example of the control tone insertion circuit 40 of FIG. 3a is illustrated in FIG. 5. In the FIG. 5 circuit, the envelope of the input information signal received at input 20 is, of course, detected by envelope detector 26 to produce an envelope signal at input 39 of the control tone insertion circuit 40. This envelope signal is then subtracted from a threshold signal which is at or near the envelope level at which the compression threshold exists. This subtraction of the envelope signal from a threshold occurs in a threshold subtractor 42 to produce a reference value R. The reference value R is provided first and second detectors 44, 46 respectively. If the reference value exceeds zero, this is detected by the first detector 44 and a control signal is provided to the gain selector circuit 48 which accordingly selects the gain output to equal a constant. In the event that the reference value R is less than zero as detected by the second detector 46, the second detector 46 produces an output supplied to the gain selector circuit 48 causing it to produce a gain value proportional to 1-R. Thus, so long as the envelope level is greater than or equal to the threshold, the control tone level is a constant. When the envelope level falls below the threshold level, the control tone gain begins to increase.

Figure 6A:
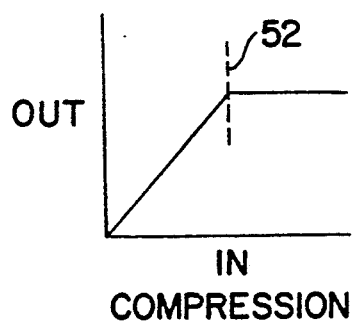
FIG. 6(a)–6(c) illustrate the relationship of control tone level to compression when using the control tone insertion control circuit 40 of FIG. 5.
Figure 6B:
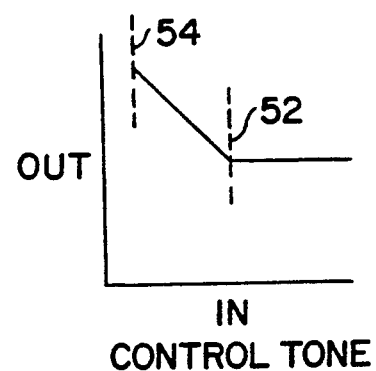
Figure 6C:
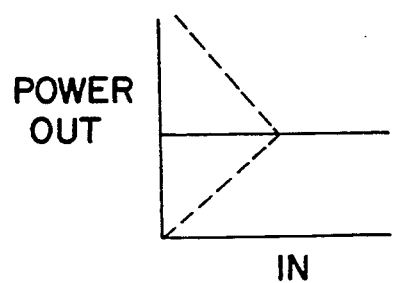

Operation of the control tone insertion control circuit 40 of FIG. 5 can be best seen by reference to FIG. 6(a-c). In FIG. 6a, the output of the compressor is shown in relation to the compressor input. The compression threshold is illustrated as point 52 in this figure. The input level at this compression threshold 52 would normally be at or near the threshold Th utilized in the threshold subtractor 42 of FIG. 5. The control tone level output is similarly related to control tone input level in FIG. 6(b). When the compressor 22 of FIG. 3(a) is producing a constant output, the reference value R produced by the threshold subtractor 42 will be greater than or equal to zero. In such a case, the gain of the control tone will be constant as illustrated to the right of the compression threshold 52 of FIG. 6(b). On the other hand, when the envelope falls below the threshold level used in threshold subtractor 42, the reference value becomes detected by the second detector 46, thereby causing the control tone gain to increase as illustrated to the left of the compression threshold 52 of FIG. 6(b). The net result of the output of the compressor as illustrated in FIG. 6(a) and the output of the control tone generator as illustrated in FIG. 6(b) which is also the output of comparator 32, of FIG. 3(a) is illustrated in FIG. 6(c). Here, the power output is held relatively constant as the compressor looses effectiveness do to the boosting of the control tone.

FIG. 6(b) illustrates that the control tone boost also has a lower practical limit 54 below which the control tone may not be effectively boosted. This limit is normally reached only when the output of the compressor falls to a value below which the level of any detectable signal content.

The above described embodiment of the control tone insertion control circuit 40 shows only one example of this circuit. Alternatively, if desired, the control tone insertion control circuit 40 may, instead of gradually reducing the impedance of variable attenuator 38 and upon detecting a minimum input signal level, reduce the impedance of variable attenuator 38 in a stepwise fashion. Nonlinear variation in impedance may also be used. For example, referring to FIG. 2, if the compression "knee" 14 occurs approximately at −48 dB (line 16) it may be desirable to stepwise reduce the attenuation of the variable attenuator 38 at a lower input signal power, for example, −53 dB as illustrated by line 18 of FIG. 2. Alternatively, it may also be desirable to begin reduction of the attenuation of variable attenuator 38 at an input signal level (represented by line 18) a predetermined level below the compression "knee" 14 as represented by line 16 and to gradually reduce the impedance to gradually increase the power within the control tone signal as the compressed signal level continues to decrease. Of course, this control of the variable attenuation could be performed in any fashion and for any threshold desired.

The control tone insertion circuit 40 may also be any circuit which monitors the envelope produced by the envelope detector 26 of the envelope circuit 24 and provide an output signal related thereto to control the reduction of the variable impedance 38 as would occur to one of ordinary skill in the art. For example, the control tone insertion control circuit may comprise a peak detection circuit and a comparator circuit. If the control tone insertion control circuit 40 determines that the power level of the compressed signal falls below a certain level which represents that the input signal is below the upper 48 Db range in which full compression occurs, the control tone insertion control circuit 40 will produce a control signal which is supplied to the variable attenuator 38 to allow the control tone to be outputted at higher power level. On the other hand, if the control tone insertion control circuit determines that the power level of the compressed signal is above a predetermined level, the control tone insertion control circuit produces a control signal which controls the variable attenuator to produce a control tone having a power level 5 Db (or any level) below the average power level of the compressed signal. As described above, this can be performed gradually or stepwise.

The combination information signal output from the summer 32 is provided to transmitter 34 which transmits the signal over a desired transmission medium 36. In a typical embodiment, a signal sideband transmitter would normally transmit the modulated combined information signal through the atmosphere in a known manner.

Figure 3B:
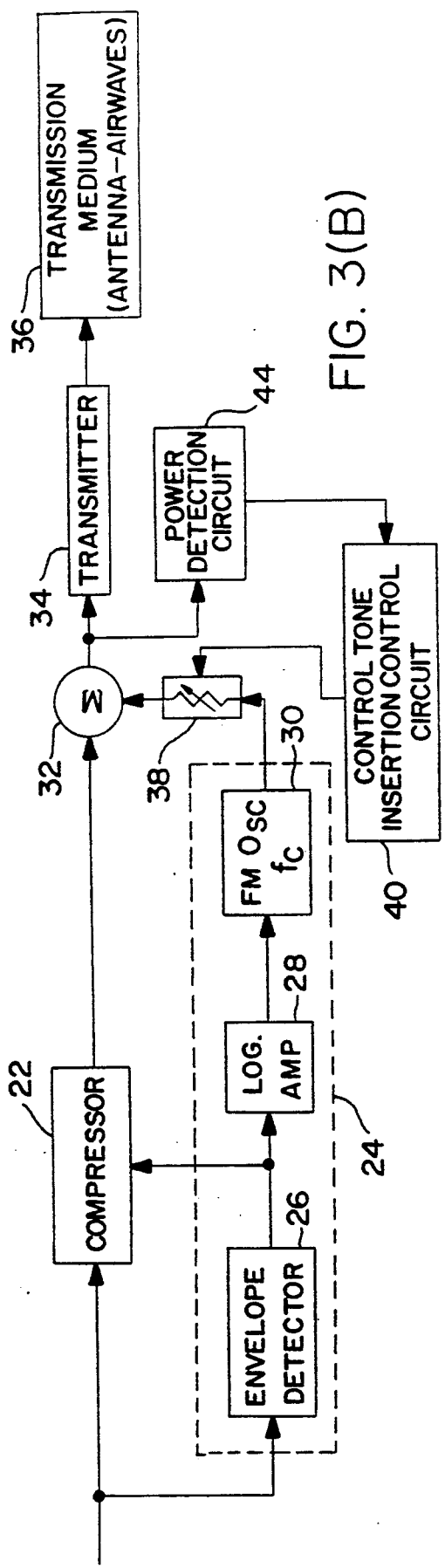
FIG. 3(b) illustrates another embodiment of a Lincompex modulator according to the teachings of the present invention which compensates for power loss or attenuation in the compressed input signal according to peak power of the combined information signal.

FIG. 3(b) illustrates the further embodiment of the present invention. In this embodiment, which is otherwise similar to embodiment 3(a), the control tone insertion control circuit 40' is also responsive to a power detection circuit 44 which monitors the power of the combined information signal output from the summer 32. In this embodiment, if the control tone insertion control circuit 40' determines that the peak power level of the combined information signal is below a predetermined level, the control tone insertion control circuit 40' will produce a control signal controlling the variable attenuator 38, to reduce its impedance and allow the control tone to be outputted at a higher power level. On the other hand, if the control tone insertion control circuit 40' determines that the peak power level of the combined information signal is above this predetermined level, the control tone insertion control circuit 40' produces a control signal which controls the variable attenuator 38 to produce a control tone of conventional power, for example, −5 dB below the power level of the compressed information signal.

Figure 2:
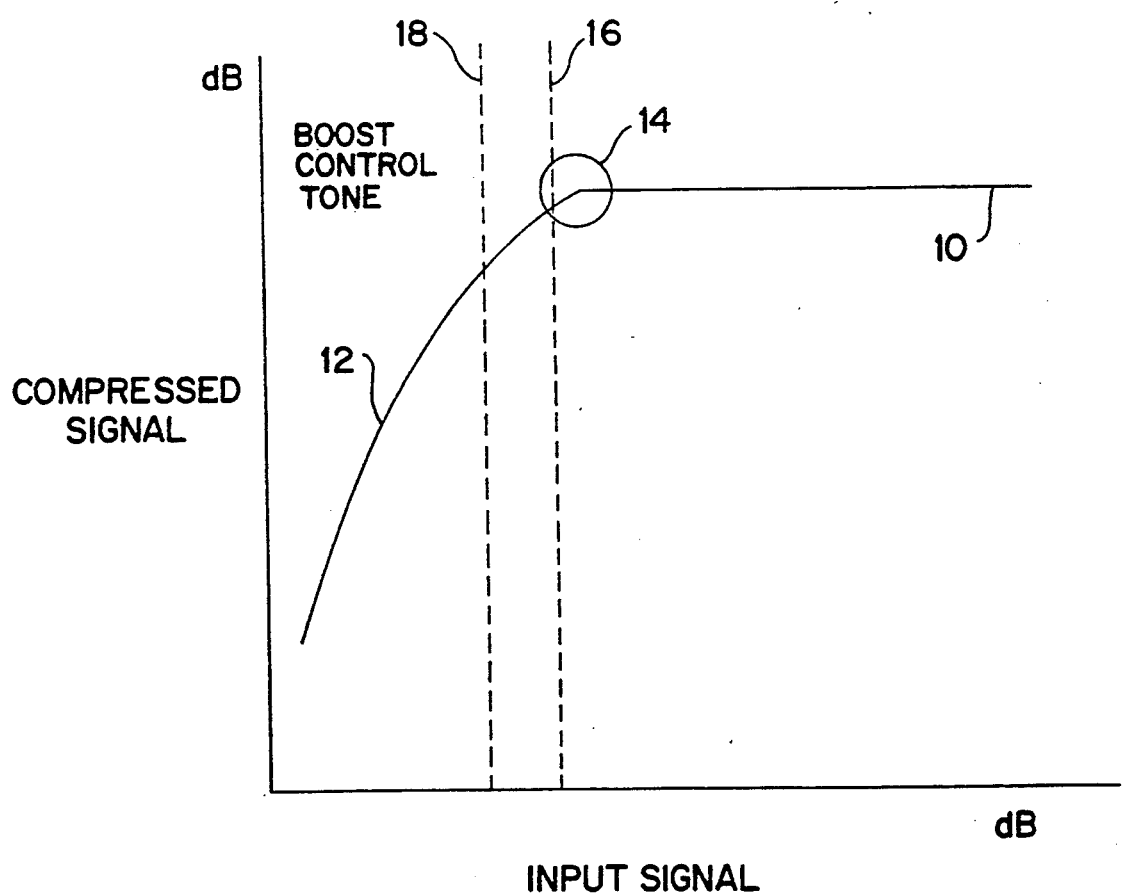
FIG. 2 graphically illustrates the input/output characteristics of an input compressor 22 and their relationship to the control tone boosting of the present invention.
Figure 3C:
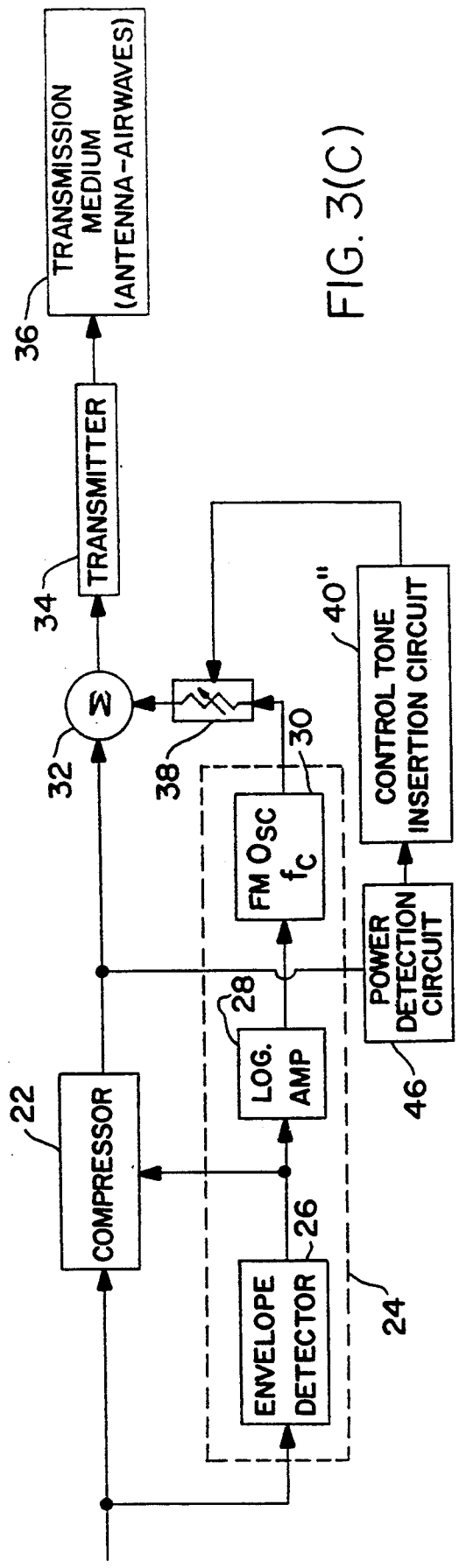
FIG. 3(c) illustrates still another embodiment of a Lincompex modulation of the present invention which compensates for power loss or attenuation in the compressed input signal according to peak power of the combined information signal.

FIG. 3(c) illustrates still another embodiment of the present invention in which a power detection circuit 46 monitors the power of the compressed information signal produced by compressor 22 and provides a signal representative of the power level of the compressed information signal to the control tone insertion circuit 40" to thereby control the variable attenuator in the manner otherwise explained above. It should be understood that the control tone insertion circuit may be modified within the teachings of the present invention in any manner so as to monitor the power of the Lincompex modulated signal and control the power level of the control tone so as to boost control tone power during periods in which the compressor output is linear as shown in portion 12 of the curve of FIG. 2 to thereby enhance the performance of a Lincompex system at low input information signal levels.

OPERATIONS OF THE PRESENT INVENTION

In operation, with reference to FIGS. 3(a-c), a transmitter transmits a combined information signal having a compressed information signal and a control tone signal. This waveform is usually transmitted over a preselected channel frequency to which a receiver is tuned. The transmission medium 36 utilized in the present invention may be any type of transmission medium, an atmospheric radio waveband, a telephone line, coaxial cable or fiber optic cable, or any other path usable for transmission of the selected complex information waveform such as voice or data. Also, the two components of the combination information waveform can be sent via two separate transmission mediums if desired.

Referring to FIG. 3(a), the compressor 22 and control tone generator 24 function otherwise identically as described in FIG. 1(a). However, in accordance with the teachings of the present invention, the output of FM oscillator 30 as shown in FIG. 1(a) is produced at a higher voltage and corresponding power level and is supplied to the variable attenuator 38 which controls the voltage level of the control tone signal supplied to the summer 32. Control of this variable attenuator is performed by control tone insertion control circuit 40. The control tone insertion control circuit 40 and variable attenuator 38 are used to boost the control tone during periods at which the compressed signal exhibits a power drop due to the low input levels of the input information signal. This power drop in the compressed signal occurs when the input signal falls below the range of compression of the compressor 22. For example, this range might be 48 dB and would extend from maximum power of the input signal(0 dB) to −48 dB. In FIG. 2, this range is exhibited by the horizontal line 10 in which the compressed information signal remains constant in power with varying input information signal power. At the "knee" 14 of the curve of FIG. 2, the compressor can no longer continue to supply a constant power output. Thus, the output power of the compressed information signal drops as illustrated by line 12 of FIG. 2. As the power of the control tone in the conventional Lincompex system of FIG. 1(a) is constant, the prior art system therefore exhibits a power drop in the combined information signal output from the summer 32 and thus exhibits reduced transmitter efficiency.

The teachings of the present invention cause the power of the control tone to be increased in an area in which the compressed information signal power is dropping. The intent is to make the output signal power of the Lincompex modulator as produced at the output of summer 32 more nearly constant to optimize the efficiency of the transmitter 34 and enhance the reception of the Lincompex signal at low input information signal levels. Thus, the control tone insertion control circuit 40 controls the variable attenuator 38 to decrease the level of attenuation produced thereby at reduced compressed information signal levels as shown in segment 12 of the graph of FIG. 2.

According to the teachings of the present invention, the control tone insertion control circuit 40 can control the variable attenuator 38 to gradually reduce the attenuation of the control tone caused by variable attenuator 38 as the power of the compressed information signal begins to drop at the "knee" point, beginning the variation of attenuation gradually at the point shown by line 16 of FIG. 2, or alternatively, for example, the insertion control circuit ma stepwise very the impedance of the variable attenuator 38 at a point a certain level below the "knee" as shown, for example, by vertical line 18 of FIG. 2. For example, if the compression knee occurs at −48 dB from peak input signal power, and if the variable attenuator 38 is controlled so as to boost the control signal 8 dB, the switching point illustrated by vertical line 18 of FIG. 2 as controlled by the control tone insertion control circuit 40 would occur at (−48 −8)Db or −56 dB.

The detection of the drop in compressed information signal power may be performed by a variety of techniques. For example, as illustrated in FIG. 3(a), the envelope signal supplied to the compressor is monitored by the control tone insertion control circuit 40. When the level of this envelope signal drops below a predetermined level, the control tone insertion control circuit senses that the envelope signal drops below a threshold representative of the level at which the input information signal falls below the compression knee 14, and begin attenuation either gradually, or stepwise a predetermined level below the knee 14. In the case of FIG. 3(b), the total power of the Lincompex modulator is monitored at the output of the summer 32 by the power detection circuit 44. The detect power is then used by the control tone insertion control circuit 40 to control the variable attenuator 38 to maintain the power output from the summer 32 relatively constant, thereby boosting the control tone when the input information signal falls below the knee 14. Alternatively, it would also be possible to perform stepwise control as discussed above.

In the FIG. 3(c) embodiment, the compressed information signal power is monitored by power detection circuit 46 and, when this compressed information signal detected by power detection circuit 46 begins to drop in power, the control tone insertion circuit begins variation of the variable attenuator 38 to increase the control tone signal level. Alternatively, control of the attenuator can also be done in a stepwise manner in this embodiment as previously discussed.

The above-mentioned detection schemes are exemplary. According to the teachings of the present invention, the power of the compressed information signal, input information signal, combined information signal output from the summer 32, or a signal derived from any or all these may be utilized to sense the drop of the compressed information signal below the compression knee 14 to provide compensation of the control tone signal.

By boosting the control tone at periods of low input information signal level, the system of the present invention allows the receiver to more easily maintain a signal lock on the control tone, thus reducing the problem of loss of decreasing control tone signal to noise (S/N) ratio. Thus, the signal to noise ratio of quiet passages may be substantially improved in accordance with the teachings of the present invention.

A better understanding of the operation of the present invention may be had by reference to FIGS. 4(a–f). FIG. 4a is a schematic illustration of an input information signal which, for example, may be human voice. In the example of FIG. 4(a) the signal gradually decreases. FIG. 4(b) illustrates the control tone transmitted according to conventional techniques. The control tone according to these techniques is constant. FIG. 4(c) illustrates the compressor output of compressor 22 in any of the figures of the present invention. The compressor output power is maintained substantially constant until the compression knee (14 of FIG. 2) is reached. When the signal of 4(a) drops below the compression knee, in this case −48 dB below peak signal level, the compressor is no longer able to maintain a constant output and thus a lower amplitude output of the compressor is transmitted. According to the teachings of the present invention, this drop in the signal level of the output of the compressor 22 is sensed by any known manner and, in response to the detected drop, the control tone insertion circuit 40 reduces the attenuation of variable attenuator 38 so as to boost the power of the control tone signal as illustrated in FIG. 4(d). Thus, the combined power of the control tone and input information signal is maintained relatively constant.

Figure 4A:
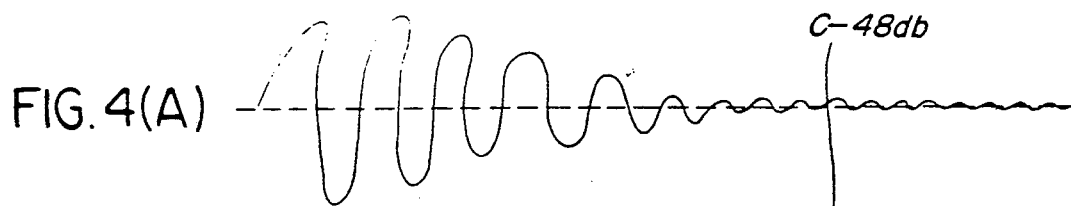
FIG. 4(A)–4(F) illustrate signals useful to understand the techniques of the present invention as implemented in FIGS. 3(a) and (b).
Figure 4B:
Figure 4C:
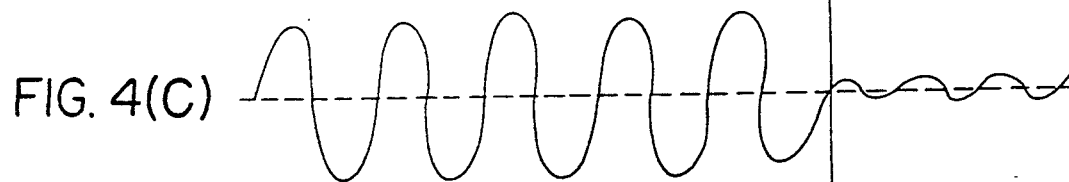
Figure 4D:
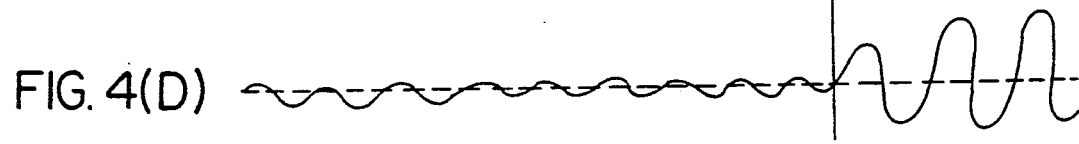
Figure 4E:
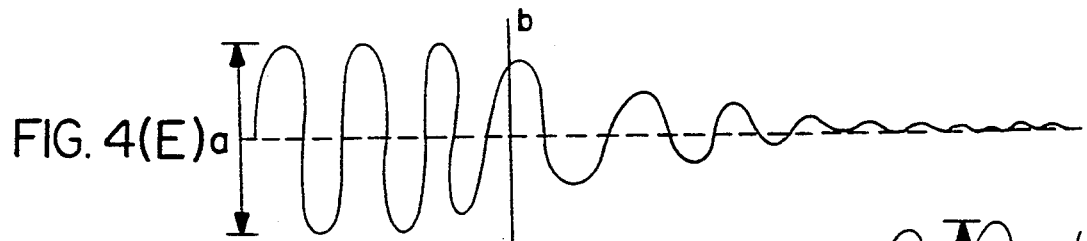
Figure 4F:

In FIGS. 4(e) and 4(f), vertical line b illustrates the compression knee. Here, the compressed information signal output from the compressor 22 as illustrated in FIG. 4(e) can clearly be seen to gradually decrease as the input signal gradually decreases. FIG. 4(f) illustrates the gradual increase of the control tone signal by varying the attenuation of variable attenuator 38 under control tone insertion circuit. As the compressed information signal gradually decreases, the control tone signal gradually increases to a maximum level such that the sum of the two signals are held relatively constant. It should be noted that all of FIGS. 4(a)–4(f) utilize a varying amplitude sine wave to represent the information signal. In practice, the information signal would appear substantially more complex. However, the effect of the present invention on this information signal can be readily seen from the FIG. 4(a)–4(f) waveforms.

From the above described preferred embodiments, it is apparent that Lincompex techniques ma be utilized to transmit complex input information signals including either voice or data with enhanced performance through the boosting of the control tone power level at low input signal levels, ensuring enhanced control tone signal S/N during quiet passages. By increasing the power of the control tone when the power level of the compressed signal is nonexistent or substantially low to enhance transmitter efficiency, a Lincompex receiver can better maintain control tone lock so that the quieting characteristics of the Lincompex demodulator can be more thoroughly realized.

From the above-described embodiments of the present invention, it is apparent that the present invention may be modified as would occur to one of ordinary skill in the art without departing from the spirit and scope of the present invention which should be defined solely by the appended claims. Changes and modifications of the system contemplated by the present preferred embodiments will be apparent to one of ordinary skill in the art.

What is claimed:

1. A method of preparing an input information signal for transmission over a communications channel comprising:
   (a) developing an envelope signal representative of the envelope of the input information signal;
   (b) compressing the input information signal in proportion to the level of said envelope signal within a compression range within which the compressed input information signal has a substantially constant output level;
   (c) developing a control tone signal having a control tone signal level from said envelope signal;
   (d) boosting the control tone signal level when the level of the compressed input information signal level falls below said substantially constant output level.

2. The method of claim 1 further comprising summing the compressed input information and the control tone signal to produce a combined information signal for transmission over a communication channel.

3. The method of claim 1 further comprising:
   (e) sensing a parameter related t output level of said compressed input information signal, said step (d) of boosting occurring in response to said parameter monitored by said step (e) of sensing.

4. The method of claim 3 wherein said step (a) of developing includes detecting the envelope of the input information signal to produce an envelope signal;
   said monitored parameter being said envelope signal.

5. The method of claim 3 further comprising detecting the power of said compressed input information signal;
   said monitored parameter being the power of said compressed input information signal.

6. The method of claim 2 further comprising:
   (e) sensing a parameter related to output level of said compressed input information signal, said step (d) of boosting occurring in response to said parameter monitored by said step (e) of sensing.

7. The method of claim 6 further comprising detecting the power of said combined information signal;
   said monitored parameter being the power of said combined information signal.

8. The method of claim 1 wherein said information signal is any complex information signal, said compressed information signal having a predetermined frequency band, and said control tone signal having a predetermined control tone band;
   said method further comprising shifting the center frequency of at least one of said predetermined frequency band and control tone band to prevent overlap therebetween.

9. The method of claim 8 wherein said step of shifting is performed by frequency shifting the complex information signal to a different frequency so that all frequencies in said predetermined frequency band are separated from any frequencies within said control tone band.

10. A method of preparing an information signal for transmission over a communication channel comprising the steps of:
    (a) generating a control tone having a power level and representing envelope information of the information waveform;
    (b) compressing the information waveform to produce a compressed signal having a power level by dividing the information waveform by the envelope of the information waveform; and
    (c) varying the power level of the control tone to produce n adjusted control tone in response to changes in a parameter related to the power level of the compressed signal.

11. The method as claimed in claim 10, further comprising the step of:
    (d) summing the compressed signal and adjusted control tone prior to transmission over a communication channel.

12. The method as claimed in claim 10, wherein said step (a) comprises the steps of:
    determining the envelope information of the information waveform;
    producing a logarithm signal of the envelope information; and
    frequency modulating a carrier using the logarithm signal to produce the control tone.

13. The method as claimed in claim 10, wherein said step (c) comprises the steps of:
    generating a control signal to control the power level of the control tone in accordance with the power level of the compressed signal; and
    varying an attenuation factor of the power level of the control tone according to the control signal.

14. The method as claimed in claim 10, wherein the information waveform is a voice signal.

15. The method s claimed in claim 10, wherein the information waveform is a complex data signal.

16. A method of preparing an information signal for transmission over a communication channel comprising:
    (a) inputting an information signal;
    (b) generating a Lincompex signal having a compressed signal and a control tone representing the information signal, each having a power level; and
    (c) varying the power level of the control tone to maintain the combined output signal at a constant power level.

17. The method as claimed in claim 16, wherein said step (b) comprises the steps of:
    determining the envelope of the information signal;
    producing a logarithm signal representative of the logarithm of the envelope; and
    frequency modulating a carrier using the logarithm signal to produce the control tone.

18. The method as claimed in claim 23, wherein said step (c) comprises the steps of:
    (e) generating a control signal to control the power level of the control tone in accordance with a parameter relative to the power level of the compressed signal; and
    (f) varying an attenuation factor of the power level of the control tone according to the control signal.

19. A system for preparing an input information signal for transmission over a communications channel comprising:
    an envelope detector developing an envelope signal representative of the envelope of the input information signal;
    a compressor compressing the input information signal in proportion to the level of said envelope signal within a compression range within which the compressed input information signal has a substantially constant output level;

means, responsive to said envelope detector, for developing a control tone signal having a control tone signal level from said envelope signal;

control tone modulation means for boosting the control tone signal level received from said means for developing when the level of the compressed input information signal level falls below said substantially constant output level.

20. The system of claim 19 further comprising a summer summing the compressed input information and the control tone signal to produce a combined information signal for transmission over a communication channel.

21. The system of claim 19 further comprising:
means for measuring a parameter related to output level of said compressed input information signal, said control tone modulation means boosting the control tone signal level in response to said measured parameter.

22. The system of claim 21 wherein said envelope detector is said means for measuring, said measured parameter being said envelope signal.

23. The system of claim 21 wherein said means for measuring comprises a power detector detecting the power of said compressed input information signal;
said measured parameter being the power of said compressed input information signal.

24. The system of claim 20 further comprising:
means for measuring a parameter related to output level of said compressed input information signal, said control tone modulation means boosting the control tone signal level in response to said measured parameter.

25. The system of claim 24 wherein said means for measuring comprises a power detector detecting the power of said combined information signal;
said measured parameter being the power of said combined information signal.

26. The system of claim 19 wherein said information signal is any complex information signal, said compressed information signal having a predetermined frequency band, and said control tone signal having a predetermined control tone band;
said system further comprising mixer means for shifting the center frequency of at least one of said predetermined frequency band and control tone band to prevent overlap therebetween.

27. The system of claim 26 wherein said mixer means frequency shifts the complex information signal to a different frequency so that all frequencies in said predetermined frequency band are separated from any frequencies within said control tone band.

28. A system for preparing information signal for transmission over a communication channel comprising:
control tone generating means for generating a control tone representing envelope information of said information signal, said control tone having a power level;
compressing means, responsive to said control tone generating means, for compressing said information signal into a compressed signal by dividing said information waveform by said envelope of said information signal said compressed signal having a power level; and
power compensation means for varying the power level of said control tone to produce an adjusted control tone in response to changes in a parameter related to the power level of said compressed signal.

29. The system as claimed in claim 28, wherein said transmitting means comprises:
summing means, operatively connected to said compressing means and said power compensation means, for summing said compressed signal and said adjusted control tone prior to transmission.

30. The system as claimed in claim 28, wherein said control tone generating means comprises:
envelope detecting means, operatively connected to said input means, for determining said envelope information of said information signal;
log amplifier means, operatively connected to said envelope detecting means, for producing a logarithm signal representative of the logarithm of said envelope information; and
modulation means, operatively connected to said log amplifier means, for frequency modulating a carrier with said logarithm signal to produce said control tone.

31. The system as claimed in claim 28, wherein said power compensating means comprises:
control tone power control means, operatively connected to said compressing means, for generating a control signal to control the power level of said control tone in accordance with the power level of said compressed signal; and
power attenuation means, operatively connected to said control tone generating means and said control tone power control means, for varying an attenuation factor of the power level of said control tone according to said control signal.

32. The system as claimed in claim 29, wherein said power compensating means comprises:
power detecting means, operatively connected to said summing means, for measuring power of the summed signal;
control tone power control means, operatively connected to said power detecting means, for generating a control signal to control the power level of said control tone according to the power level of said summed signal such that the power of said summed signal is maintained at a relatively constant level; and
power attenuation means, operatively connected to said control tone power control means and said control tone generating means, for variably attenuating the power level of said control tone according to said control signal.

33. The system claimed in claim 28, wherein said information signal is a voice signal.

34. The system as claimed in claim 28, wherein said information signal is a complex data signal.

35. A system for preparing an information signal for transmission over a communication channel comprising:
input means for inputting an information waveform;
modulating means, operatively connected to said input means, for producing an output signal including a compressed signal and a control tone, each having a power level; and
power compensation means, operatively connected to said modulating means, for varying the power level of said control tone to maintain said output signal at a constant power level.

36. The system as claimed in claim 35, wherein said Lincompex modulating means comprises:

envelope detecting means, operatively connected to said input means, for determining envelope information of said information signal;

log amplifier means, operatively connected to said envelope detecting means, for producing a logarithm signal representative of the envelope; and modulation means, operatively connected to said log amplifier means, for frequency modulating a carrier with said logarithm signal to produce said control tone.

37. The system as claimed in claim 35, wherein said power compensating means comprises:

control tone power control means, operatively connected to said modulating means, for generating a control signal to control the power level of said control tone in accordance with a parameter related to the power level of said compressed signal; and power attenuation means, operatively connected to said modulating mens and said control tone power control means, for variably attenuation the power level of said control tone according to said control signal.

38. The system as claimed in claim 35, wherein said power compensating means comprises:

power detecting means, operatively connected to said Lincompex modulating means, for measuring a power of the signal;

control tone power control means, operatively connected to said Lincompex modulating means and said power detecting means, for generating a control signal to control the power level of said control tone to maintain the power level of said signal relatively constant; and power attenuation means, operatively connected to said control tone power control means and said Lincompex modulating means, for variably attenuation the power level of said control tone according to said control signal.

* * * * *